(12) United States Patent
Ishikawa

(10) Patent No.: US 8,780,647 B2
(45) Date of Patent: Jul. 15, 2014

(54) SEMICONDUCTOR DEVICE

(75) Inventor: Toru Ishikawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 42 days.

(21) Appl. No.: 13/491,000

(22) Filed: Jun. 7, 2012

(65) Prior Publication Data

US 2012/0314511 A1 Dec. 13, 2012

(30) Foreign Application Priority Data

Jun. 8, 2011 (JP) ................... 2011-128541

(51) Int. Cl.
*G11C 7/10* (2006.01)
(52) U.S. Cl.
CPC .................... *G11C 7/1051* (2013.01)
USPC ............. 365/189.05; 365/201; 365/189.011; 365/189.04
(58) Field of Classification Search
CPC .......... G11C 29/12; G11C 5/02; G11C 29/48; G11C 5/063; G11C 29/00; G11C 5/06
USPC ................. 365/189.05, 201, 189.011, 189.04
See application file for complete search history.

(56) References Cited

U.S. PATENT DOCUMENTS

| 2009/0001367 | A1  | 1/2009 | Baek et al. |
| 2009/0091333 | A1  | 4/2009 | Chung et al. |
| 2011/0057819 | A1* | 3/2011 | Ide et al. ........................ 257/773 |
| 2011/0089973 | A1* | 4/2011 | Kondo ............................ 326/82 |

FOREIGN PATENT DOCUMENTS

| JP | 2009-10390 A | 1/2009 |
| KR | 2009-0034785 A | 4/2009 |

OTHER PUBLICATIONS

Korean Office Action issued Jun. 20, 2013 in corresponding Korean Application No. 2012-0061020.

* cited by examiner

*Primary Examiner* — Thong Q Le
(74) *Attorney, Agent, or Firm* — Sughrue Mion, PLLC

(57) ABSTRACT

A device includes a semiconductor substrate, a first penetrating electrode penetrating through the semiconductor substrate, a first test pad, and a first tri-state buffer coupled between the first penetrating electrode and the first test pad. The first tri-state buffer receives a buffer control signal at a control terminal thereof. The device further includes a buffer control circuit supplying the buffer control signal to the first tri-state buffer.

20 Claims, 13 Drawing Sheets

SEMICONDUCTOR DEVICE

TECHNICAL FIELD

1. Reference to Related Application

This application is based upon and claims the benefit of the priority of Japanese patent application No. 2011-128541, filed on Jun. 8, 2011, the disclosure of which is incorporated herein in its entirety by reference thereto. This invention relates to a semiconductor device. More particularly, it relates to a semiconductor device in which a plurality of semiconductor chips, for example, memory devices, having the same function, are stacked together.

2. Background

Patent Document 1 shows a semiconductor device in which a plurality of semiconductor chips are stacked together and interconnected by penetrating electrodes, and which includes a pad 120. The pad is used to test each semiconductor chip at a stage before a plurality of the semiconductor chips are stacked together.

[Patent Document 1]
JP Patent Kokai Publication No. JP2009-10390A, which corresponds to US Patent Application Publication No. US2009/001367.

SUMMARY

The following analysis is given by the present invention.

Among the stacked semiconductor devices, made up of a plurality of semiconductor chips stacked together, there is such a semiconductor device composed of a plurality of semiconductor chips of different sorts stacked one upon others. An example of such device is a memory system in which a stacked memory chip assembly, composed of a plurality of memory chips stacked together, is stacked on a semiconductor chip of a different sort, for example, a memory controller chip. In the manufacture of this sort of the stacked memory system, the stacked memory chip part and the memory controller part may be prepared by different manufacturers. In such case, the stacked memory chip part and the memory controller part need to be prepared separately and tested to see if the parts prepared are in good conditions. The two parts are then assembled together. This results in improved reliability of the ultimate product.

However, if a bump electrode formed in the stacked memory chip assembly to interconnect the stacked memory chip part and the memory controller is directly contacted, that is, a tester probe is directly applied to the bump electrode, a grazing such as needle mark may be left on the bump electrode. Such grazing may give rise to connection failure when the stacked memory chip part and the memory controller are stacked together for connection.

It may thus be envisaged to test the stacked memory chip part without directly contacting the bump electrode. That is, such a method may be thought of in which, as disclosed in Patent Document 1, a test pad used in testing pre-stack memory chips (wafer testing) is connected to a bump electrode, and in which this test pad is contacted for test after the memory chips are stacked together. However, in this case, there may be raised a problem that the pad capacity of the test pad is superimposed on the pin capacity of the bump electrode.

In an aspect of the present disclosure, there is provided a device including a semiconductor substrate, a first penetrating electrode penetrating through the semiconductor substrate, a first test pad and a first tri-state buffer coupled between the first penetrating electrode and the first test pad. The first tri-state buffer receives a buffer control signal at a control terminal thereof. The device further includes a buffer control circuit supplying the buffer control signal to the first tri-state buffer.

In another aspect of the present disclosure provides such a device that comprises a first semiconductor chip and a second semiconductor chip stacked with the first semiconductor chip. The first semiconductor chip comprises: a first semiconductor substrate including first and second main surfaces opposite to each other, a first penetrating electrode penetrating through the first semiconductor substrate, a first terminal formed on a side of the first main surface of the first semiconductor substrate and electrically connected to the first penetrating electrode, a second terminal formed on a side of the second main surface of the first semiconductor substrate and electrically connected to the first penetrating electrode, a first test pad formed on a side of the first main surface of the first semiconductor substrate, a first tri-state buffer formed on a side of the first main surface of the first semiconductor substrate, coupled between the first penetrating electrode and the first test pad, and receiving a first buffer control signal at a control terminal thereof; and a first buffer control circuit supplying the first buffer control signal to the tri-state buffer. On the other hand, the second semiconductor chip that is stacked with the first semiconductor chip and comprises a second semiconductor substrate including third and fourth main surface opposite to each other, a third terminal formed on a side of the third main surface of the second semiconductor substrate and electrically connected to the second terminal of the first semiconductor chip.

PREFERRED MODES

Exemplary Embodiment 1

Figure 1:
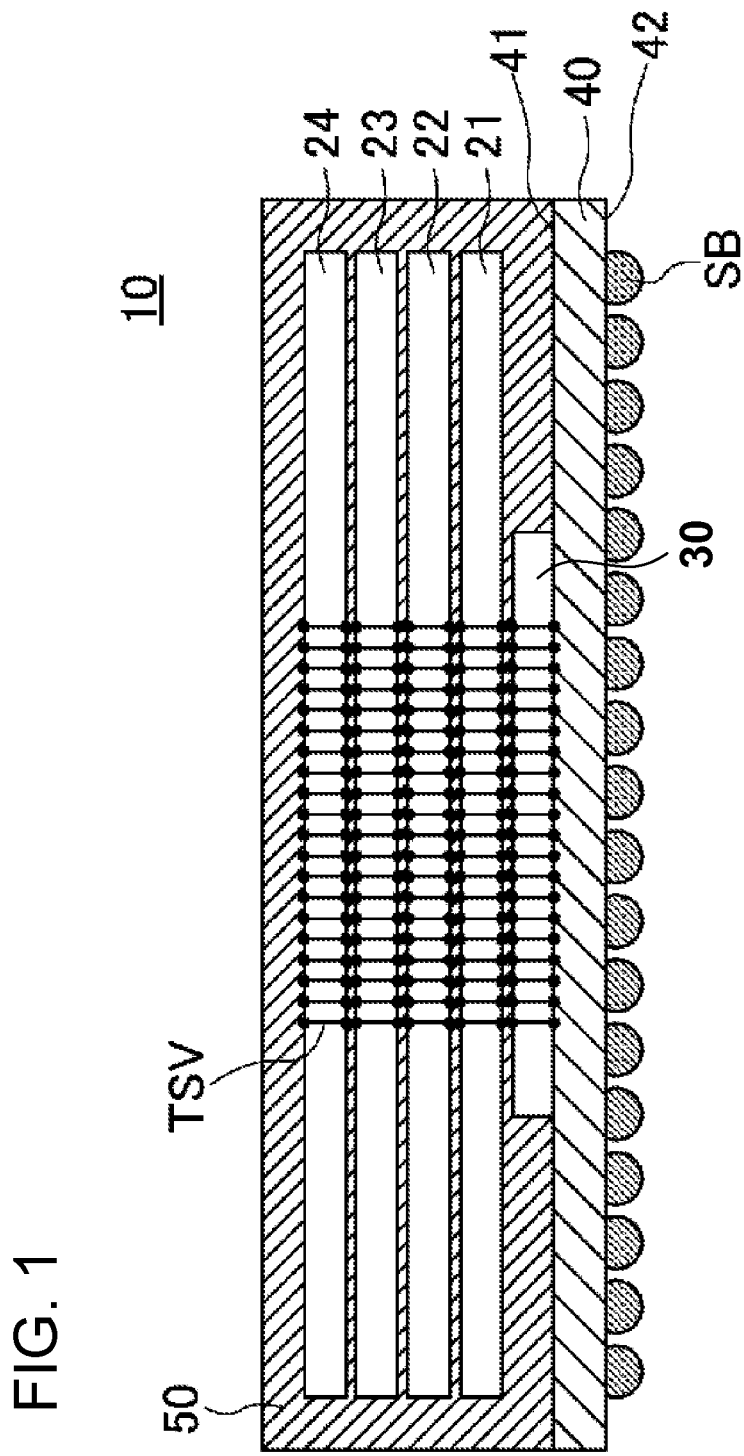
FIG. 1 is a schematic cross-sectional view for illustrating the entire structure of a semiconductor device according to an exemplary embodiment 1 of the present disclosure.

FIG. 1 depicts a schematic cross-sectional view for illustrating an entire structure of a semiconductor device 10 according to an exemplary embodiment 1 of the present disclosure.

Referring to FIG. 1, the semiconductor device 10 of the present exemplary embodiment includes four memory devices 21 to 24 and a single memory controller 30 all of which are stacked together. Each of the memory devices 21 to 24 as well as the memory controller 30 is a one-chip semiconductor device that uses a silicon substrate. The memory devices 21 to 24 are of the same circuit configuration. In the present exemplary embodiment, these are general-purpose DRAM chips only non-restrictively. Hence, the accessing methods are prescribed by relevant standards.

It is noted that the general-purpose DRAM denotes such a DRAM including both a so-called front-end part and a so-called back-end part. The front-end part includes a circuit that interfaces with outside via an external terminal. The back-end part includes a plurality of memory cell arrays and a circuit that accesses the memory cell arrays. A DDR3 (Double Data Rate 3) SDRAM (Synchronous Dynamic Random Access Memory) belongs to the general-purpose DRAM only by way of illustration.

Each of the memory devices 21 to 24 includes a plurality of penetrating electrodes TSV (Through Silicon Vias) passing through the silicon substrate to electrically interconnect vertically adjacent chips. The memory controller 30 also includes a plurality of penetrating electrodes TSV for electrical connection to a wiring provided on a front surface 41 of an interposer 40. The memory controller 30 and the memory devices 21 to 24, stacked on the interposer 40, are covered by an encapsulating resin 50 to physically protect the chips.

The interposer 40 is a circuit substrate of resin, on a reverse surface 42 of which there are formed a plurality of external terminals (solder balls) SB. The reverse surface 42 of the interposer is its second surface opposite to the front surface 41. The interposer 40 not only guarantees mechanical strength of the semiconductor device 10 in its entirety, but also acts as a re-wiring substrate to enhance the electrode pitch. In short, the electrodes formed on the front surface 41 of the interposer 40 are led to the reverse surface 42 by the through-hole electrodes to enhance the pitch of the external terminals SB by a re-wiring layer provided on the reverse surface 42. That is, the external terminals SB are formed at a pitch wider than that of the penetrating electrodes TSV. The number of the external terminals SB is merely illustrative and, in reality, the number of the external terminals SB is much larger.

Figure 2:
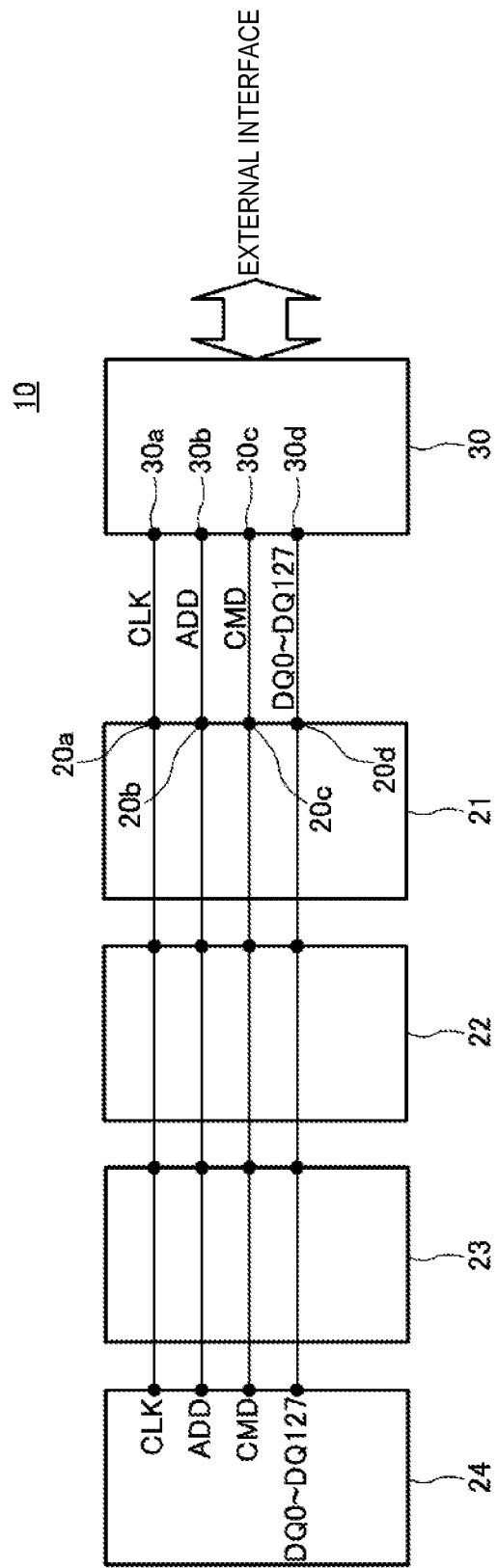
FIG. 2 is a block diagram for illustrating an interconnect structure of the exemplary embodiment 1.

FIG. 2 is a block diagram for illustrating the interconnect structure of the semiconductor device 10 of the present exemplary embodiment.

Referring to FIG. 2, the four memory devices 21 to 24 are connected to the memory controller 30 in common. Specifically, a clock terminal 30a, an address terminal 30b, a command terminal 30c and a data terminal 30d, provided in the memory controller 30, are respectively connected to clock terminals 20a, address terminals 20b, command terminals 20c and data terminals 20d provided in the memory devices 21 to 24. Hence, an external clock signal CLK, an address signal ADD and a command CMD, output from the memory controller 30, are delivered to the four memory devices 21 to 24 in common. On the other hand, read data DQ, output from the memory devices 21 to 24, are delivered on the common data bus to the memory controller 30. Conversely, write data DQ, output from the memory controller 30, are delivered on the common data bus to the four memory devices 21 to 24. In the present exemplary embodiment, 128 data terminals are provided in each chip, so that 128 bit read or write data may be transferred at a time.

Which of the memory devices 21 to 24 is to be selected by the memory controller 30 is determined by a chip select signal. It is only sufficient that chip select signal are delivered to the memory devices 21 to 24 using interconnects provided for each of the memory devices 21 to 24. If, on the other hand, the chip select signal is delivered on a common interconnect to the memory devices 21 to 24, it is only sufficient that a chip address is allocated to each of the memory devices 21 to 24 and such memory device whose chip address coincides with the chip select signal is selected.

Figure 3:
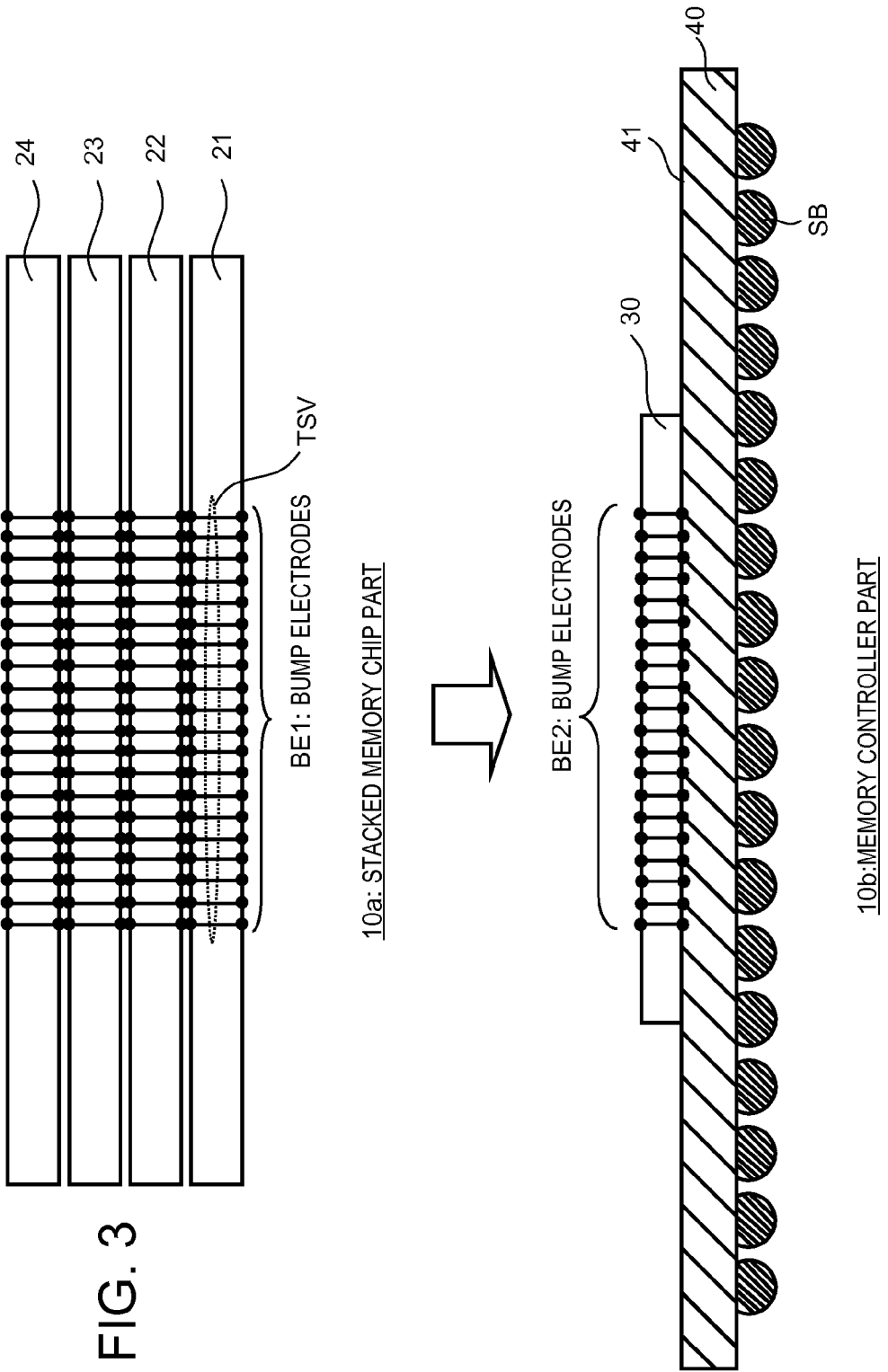
FIG. 3 is a process diagram for illustrating the process of combining a stacked memory chip part and a memory controller part together in the exemplary embodiment 1 to prepare a semiconductor device 10.

FIG. 3 depicts a process diagram for illustrating the process for manufacturing the semiconductor device 10 by combining a stacked memory chip part 10a with a memory controller part 10b in the exemplary embodiment 1. In manufacturing the semiconductor device 10, the memory devices 21 to 24, having the same circuit configuration, are put together as the stacked memory chip part 10a subject to advance position matching, as shown in the stacked memory chip part 10a of FIG. 3. Then, with the memory devices 21 to 24 thus stacked on upon others, it is confirmed by a test that the memory devices 21 to 24 operate as regularly. The stacked memory chip part 10a is then unified to the memory controller 30 and the interposer 41.

In FIG. 3, only the memory controller 30 is assembled to the interposer 40 to complete the memory controller part 10b. Then, with bump electrodes BE1 of the stacked memory chip part 10a position-matched with respect to bump electrodes BE2 of the memory controller part 10b, the stacked memory chip part 10a and the memory controller part 10b are assembled together. The resulting product is then sealed with an encapsulating resin 50 to complete the semiconductor device 10 of FIG. 1. However, it may be possible to test only the stacked memory chip part 10a by itself before completing the manufacture of the semiconductor device 10 in its entirety. In this case, any suitable optional process may be used to manufacture the completed semiconductor device 10 from the stacked memory chip part 10a, memory controller 30 and the interposer 40.

In the exemplary embodiment 1, the stacked memory chip part 10a is assembled first and it is then checked by a test that the memory devices 21 to 24 of the stacked memory chip part 10a operate as normally. The memory controller part 10b other than the stacked memory chip part 10a is assembled to the stacked memory chip part 10a to complete the semiconductor device 10. Hence, the probability that the stacked memory chip part 10a is found to be defective in the final assembling stage is rather low. As a result, the semiconductor device 10 may be manufactured to high reliability.

In testing only the stacked memory chip part 10a as a semi-finished product, probing the bump electrodes BE1 during testing is of a problem. Since the stacked memory chip part 10a is not as yet provided with the external terminals SB, it is thought to be necessary to probe the bump electrodes from e.g., a test device for testing. However, the pitch of the bump electrodes BE1, formed on the surface of the stacked memory chip part 10a, is narrower than that of the external terminals SB. These terminals prove to be the ultimate external terminals of the semiconductor device 10. The size of the bump electrode BE1 is also smaller. Thus, if the bump electrodes BE1 are directly probed by e.g., a test device, a grazing such as needle mark produced by probing is left on the bump electrode. There is a risk that such grazing gives rise to connection failure at the time of stacking the memory chip part 10a on the memory controller 30 for connection.

It may also be thought to test the stacked memory chip part without having direct contact with the bump electrodes. In this case, test pads directly connected to the bump electrodes may be used. The stacked memory chip part may then be tested by probing not the bump electrodes but the test pads from the test device. However, if the test pads are directly connected to the bump electrodes, the load capacity of the bump electrodes is increased. However, such increase in the load capacity of the bump electrodes is not desirable from the perspective of a high speed operation that may be expected of the semiconductor device 10 completed and put to practical use.

Thus, in the exemplary embodiment 1, the test pads and the bump electrodes are connected to each other by test buffers, and the stacked memory chip part 10a may be tested as the load capacity of the bump electrodes is increased only to a smallest possible value. It is unnecessary to probe the bump electrodes directly from outside. A concrete circuit configuration will now be described in detail.

Figure 4:
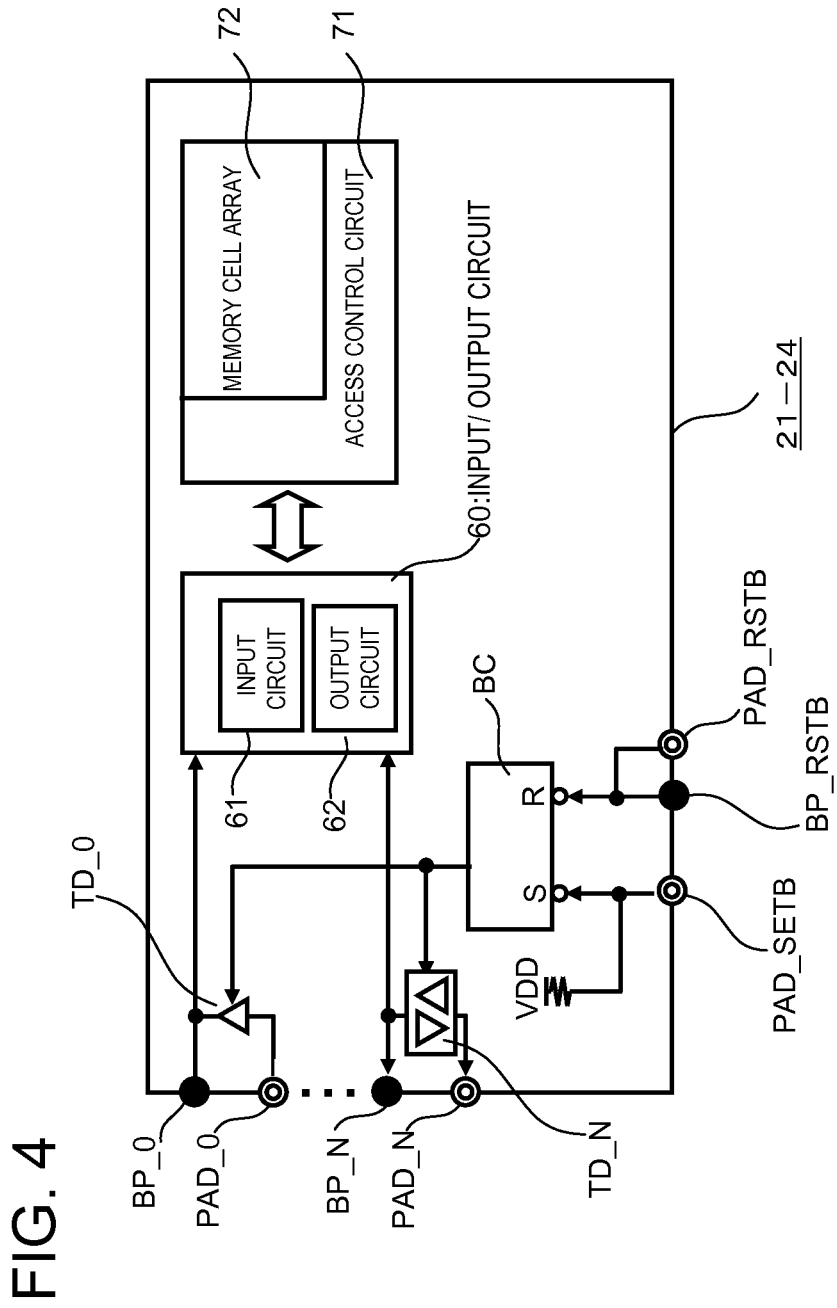
FIG. 4 is a block diagram showing a semiconductor chip in the exemplary embodiment 1.
Figure 5:
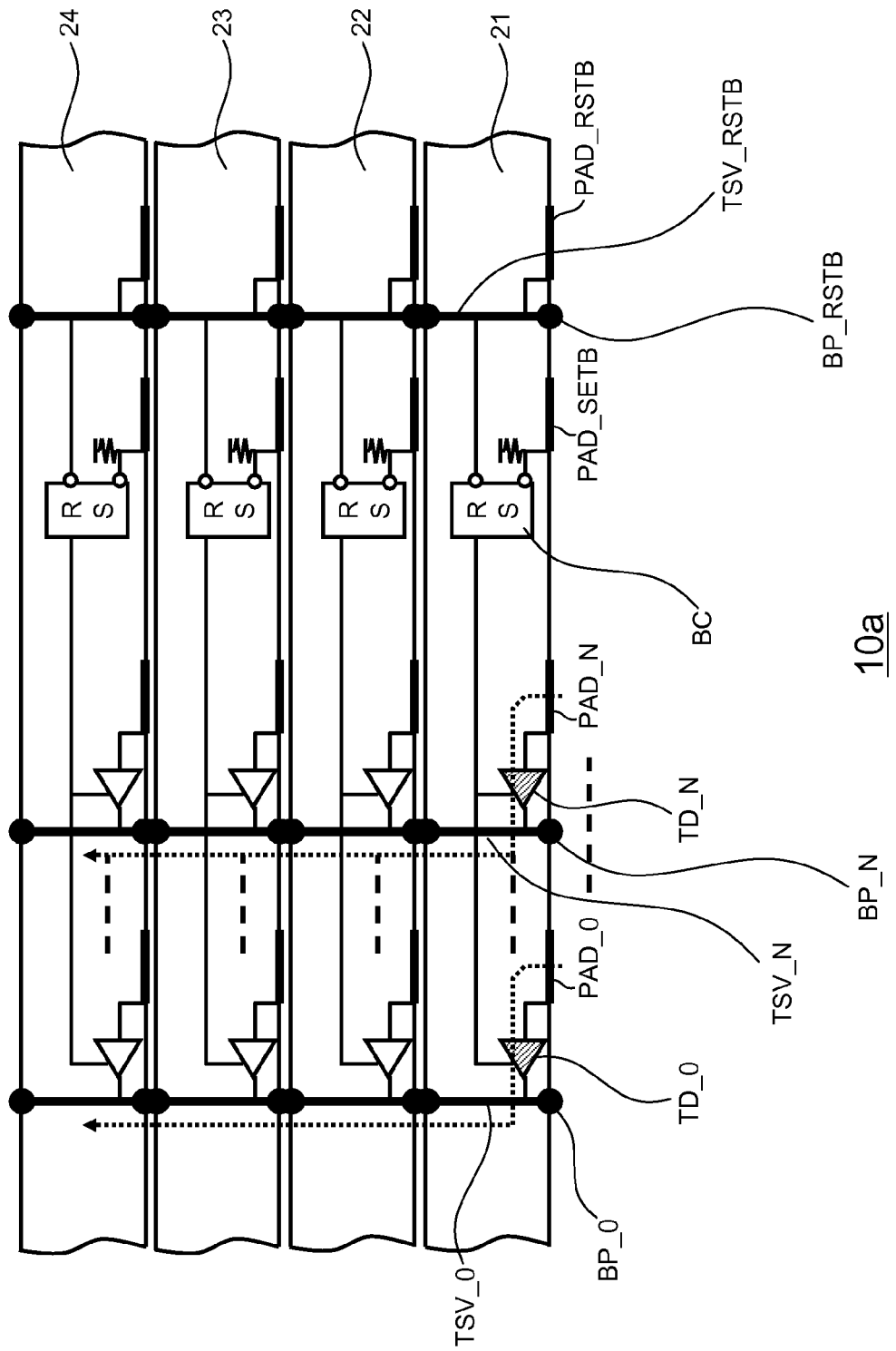
FIG. 5 is a block diagram showing a state in which a plurality of semiconductor chips are stacked together in the exemplary embodiment 1.

FIG. 4 depicts a block diagram showing the inside of a semiconductor chip in the exemplary embodiment 1. FIG. 5 depicts a block diagram showing the semiconductor chip assembled to form the stacked memory chip part 10a. The semiconductor chip is any of the memory devices 21 to 24 having the same circuit configuration, as already stated. Each of the memory devices 21 to 24 includes an input/output circuit 60, an access control circuit 71 and a memory cell array 72, as shown in FIG. 4. The access control circuit 71 controls the write and readout operations of the memory cell array 72 in response to a command delivered from outside via the input/output circuit 60. The input/output circuit includes an input circuit 61 and an output circuit 62 and receives a command signal, an address signal, a clock signal and write data delivered from outside. The input/output circuit 60 delivers the received signals or data to the access control circuit 71. The input/output circuit 60 also receives readout data delivered from the access control circuit 71 to output the received data to outside.

During the normal operation, bump electrodes BP_0 to BP_N, N being an integer not less than 2, operate as external terminals for the memory devices 21 to 24 to exchange signals with outside (e.g., memory controller). That is, the memory devices 21 to 24 operate based on signals delivered from outside via these bump electrodes, while outputting signals to outside via these bump electrodes. Among the bump electrodes BP_0 to BP_N, there are the clock terminal 20a, address terminal 20b, command terminal 20c and the data terminal 20d, shown for example in FIG. 2. In addition to the bump electrodes BP_0 to BP_N, there is a bump electrode BP_RSTB operating as an input terminal for a reset signal. Referring to FIG. 5, these bump electrodes BP_0 to BP_N and BP_RSTB are connected common to the memory devices 21 to 24 by penetrating electrodes TSV_0 to TSV_N and TSV_RSTB that pass through the stacked memory devices 21 to 24.

The test pads PAD_0 to PAD_N operate as external terminals for the memory device to exchange signals with outside (e.g., a test device) during the test operation. That is, the memory device 21, whose test pads PAD_0 to PAD_N are exposed to outside when the memory device is assembled to form the stacked memory chip part 10a (see FIG. 5), operates, during the test operation, based on a signal supplied from outside via these test pads. The memory device also outputs signals to outside via these bump electrodes. It is noted that each of the memory devices 22 to 24 is of the same circuit configuration as the memory device 21 and hence possesses test pads PAD_0 to PAD_N. However, the test pads PAD_0 to PAD_N as well as the test pads PAD_SETB and PAD_RSTB do not contribute substantially to actual operations.

A plurality of test buffers TD_0 to TD_N are connected between the test pads PAD_0 to PAD_N and nodes between the bump electrodes BP_0 to BP_N and the input/output circuit 60. The test buffers may be input buffers or output buffers, such as TD_0 of FIG. 4, or bidirectional buffers including both the input buffers and the output buffers, such as TD_N, depending on whether the associated bump electrodes are input terminals (or output terminals) or input output terminals. In the following explanation, the test buffer is assumed to be an input buffer, only by way of illustration. The test buffers TD_0 to TD_N are tri-state buffers controlled to an active state or to a non-active (Hi-z) state depending on the logical level of a buffer control signal supplied to own control terminals. Specifically, the test buffers perform the role of electrically connecting the penetrating electrodes to the test pads when the test buffers are in the active state and electrically disconnecting the penetrating electrodes from the test pads when the test buffers are in the non-active state. Specifically, the test buffers are in non-active state during the normal operation. During the test operation, the test buffers of the memory chip 21 on the lowermost layer of the stacked memory chip part 10a, having the test pads exposed to outside, are controlled to the active state, while the test buffers of the remaining memory devices 22 to 24 are controlled to the non-active state.

A buffer controller BC of FIG. 4 delivers control signals to the test buffers TD_0 to TD_N. In the exemplary embodiment 1, a set reset flipflop circuit, having a set terminal and a reset terminal as two input terminals, and an output terminal, is used as the buffer controller BC. An output terminal of the buffer controller BC is connected to control terminals of the test buffers TD_0 to TD_N in common. The set terminal S of the buffer controller BC is connected to the test pad PAD_SETB, while being pull-up connected via a resistor to a power supply potential VDD. The reset terminal R of the buffer controller BC is connected to the test pad PAD_RSTB. It is noted that, in the exemplary embodiment 1, the set signal SETB and the reset signal RSTB, respectively supplied to the test pad PAD_SETB and to the test pad PAD_RSTB, are both LOW-active. That is, the LOW level is the active level, with the HIGH level being the non-active level. Hence, the set terminal S (test pad PAD_SETB) and the reset terminal R (test pad PAD_RSTB) of the buffer controller BC both invert input signals.

Referring to FIG. 5, the bump electrodes BP_0 to BP_N are connected to the penetrating electrodes TSV_0 to TSV_N, respectively. The test pads PAD_0 to PAD_N are also connected to the penetrating electrodes TSV_0 to TSV_N via the test buffers TD_0 to TD_N, respectively. The test pad PAD_RSTB is connected to the penetrating electrode TSV_RSTB. The penetrating electrodes TSV_0 to TSV_N and TSV_RSTB connect the associated bump electrodes to reverse-side bump electrodes provided at registering locations with the substrate in-between. The penetrating electrodes TSV_0 to TSV_N and TSV_RSTB of the memory devices 21 to 24 are connected in a registering relation to one another.

In FIG. 5, the surfaces of the memory devices 21 to 24, carrying the test pads PAD_0 to PAD_N thereon, represent front sides, with the surfaces thereof opposite to the front sides being the reverse sides. It is noted that the front sides of the memory devices 21 to 24 are the sides carrying circuit elements thereon in the semiconductor substrate. The reverse sides, on the other hand, are the sides not carrying the circuit elements thereon in the semiconductor substrate. As shown in FIG. 5, the stacked memory chip part 10a in the exemplary embodiment 1 is a so-called face-down type stacked chip part in which the memory devices 21 to 24 are stacked with the front sides downwards.

(Operation of the Exemplary Embodiment 1: Normal Operation)

The operation of the exemplary embodiment 1 will now be described with reference to FIGS. 4 and 5. Initially, the normal operation following the completion of the memory devices 21 to 24 as the semiconductor device 10 shown in FIG. 1 will be explained. In this state, the bump electrodes BP_0 to BP_N and BP_RSTB of the memory devices 21 to 24 are connected to the memory controller 30 or to the external terminals SB. The test pads PAD_0 to PAD_N, PAD_SETB and PAD_RSTB of the memory devices 21 to 24 are in non-connected states. When reset signals are delivered to the bank electrodes BP_RSTB of the memory devices 21 to 24, the buffer controllers BC of the memory devices 21 to 24 are reset. The test buffers TD_0 to TD_N of the memory devices 21 to 24 are set at the non-active state as a default state. As from this time, the memory devices exchange signals with the memory controller 30 or with the external terminals SB via the penetrating electrodes TSV_0 to TSV_N and TSV_RSTB to operate as the semiconductor device 10.

(Operation of the Exemplary Embodiment 1: Testing for Singulated Memory Devices)

In a wafer or pellet state, in which the memory devices 21 to 24 of the stacked memory chip part 10a are not as yet assembled to the stacked memory chip part 10a, each singulated memory device may be tested using the test pads PAD_0 to PAD_N, PAD_SETB or PAD_RSTB.

For the memory devices 21 to 24 under test, the test pads PAD_0 to PAD_N, PAD_SETB and PAD_RSTB are connected to a test device. Since the test is for the singulated memory devices, the bump electrodes BP_0 to BP_N and BP_RSTB are in non-connected states.

Initially, the buffer controller BC of each of the memory devices 21 to 24 under test receives the active level (LOW level) set signal SETB from outside (for example, a test device) via test pad PAD_SETB of the memory device under test. The buffer controller BC sets the buffer control signal to an active state (HIGH level) in response to the active level set signal. Since the test buffers TD_0 to TD_N of the memory device under test receives buffer control signals in the active level (HIGH level) and is activated in level, the test pads PAD_0 to PAD_N of the memory device under test is electrically connected to the input/output circuit 60. In this state, each singulated memory device may be tested.

(Operation of the Exemplary Embodiment 1: Test as Stacked Memory Chip Part 10a)

Referring to FIGS. 4 and 5, the test operation of the stacked memory chip part 10a in the exemplary embodiment 1 will be explained. In testing the stacked memory chip part 10a, signals are exchanged with an outside test device via test pads of the memory device 21 whose test pads are exposed to outside. In the memory devices 22 to 24, signals are exchanged with the outside test device via penetrating electrodes TSV_0 to TSV_N and TSV_RSTB.

Initially, the buffer controller BC of the memory device 21 receives the active level (LOW level) set signal SETB from outside (for example, a test device) via its test pad PAD_SETB. The buffer controller BC sets the buffer control signal to an active state (HIGH level) in response to the active level set signal SETB. Since the test buffers TD_0 to TD_N of the memory device 21 receives the buffer control signal in the active level (HIGH level) and is activated in level, its test pads PAD_0 to PAD_N are electrically connected to the penetrating electrodes TSV_0 to TSV_N. It is noted that the test pads PAD_SETB of the memory devices 22 to 24 are not connected to e.g., an external test device and remain in the pulled-up state. Hence, the test pads are maintained in the non-active level (HIGH level). The test buffers TD_0 to TD_N of the memory devices 22 to 24 are thus maintained in the non-active state.

Using the test pads PAD_0 to PAD_N of the memory device 21, desired test signals are entered/output. As a result, signals are exchanged between the input/output circuit 60 of the memory device 21 and the external test device via test pads PAD_0 to PAD_N and the penetrating electrodes TSV_0 to TSV_N. The memory devices 22 to 24 are supplied with desired test signals via bump electrodes BP_0 to BP_N and penetrating electrodes TSV_0 to TSV_N. In this manner, the stacked memory chip part 10a may be tested without probing the bump electrodes. After the end of the testing, an active level reset signal is delivered from the reset test pad PAD_RSTB of the memory device 21 to deactivate the test buffers of the memory device 21 to electrically disconnect the test buffers from the penetrating electrodes. By so doing, the capacity of the test pads is not superimposed on that of the bump electrodes during the normal operation.

That is, in testing the stacked memory chip part 10a, the test buffers TD_0 to TD_N of the memory device 21, out of the stacked memory devices 21 to 24, whose test pads PAD_0 to PAD_N and PAD_RSTB are exposed to outside, are activated. By activating the test buffers of the memory device 21, the test pads and the bump electrodes are interconnected to permit the test to be conducted from the test pads. It is noted that the bump electrodes BP_0 to BP_N of the memory device 21 are also connected to the bump electrodes BP_0 to BP_N of the other memory devices 22 to 24 via the penetrating electrodes TSV_0 to TSV_N. The memory devices 22 to 24 may thus be tested by the test pads PAD_0 to PAD_N and the test buffers TD_0 to TD_N of the memory device 21.

Modification of Exemplary Embodiment 1

Figure 6:
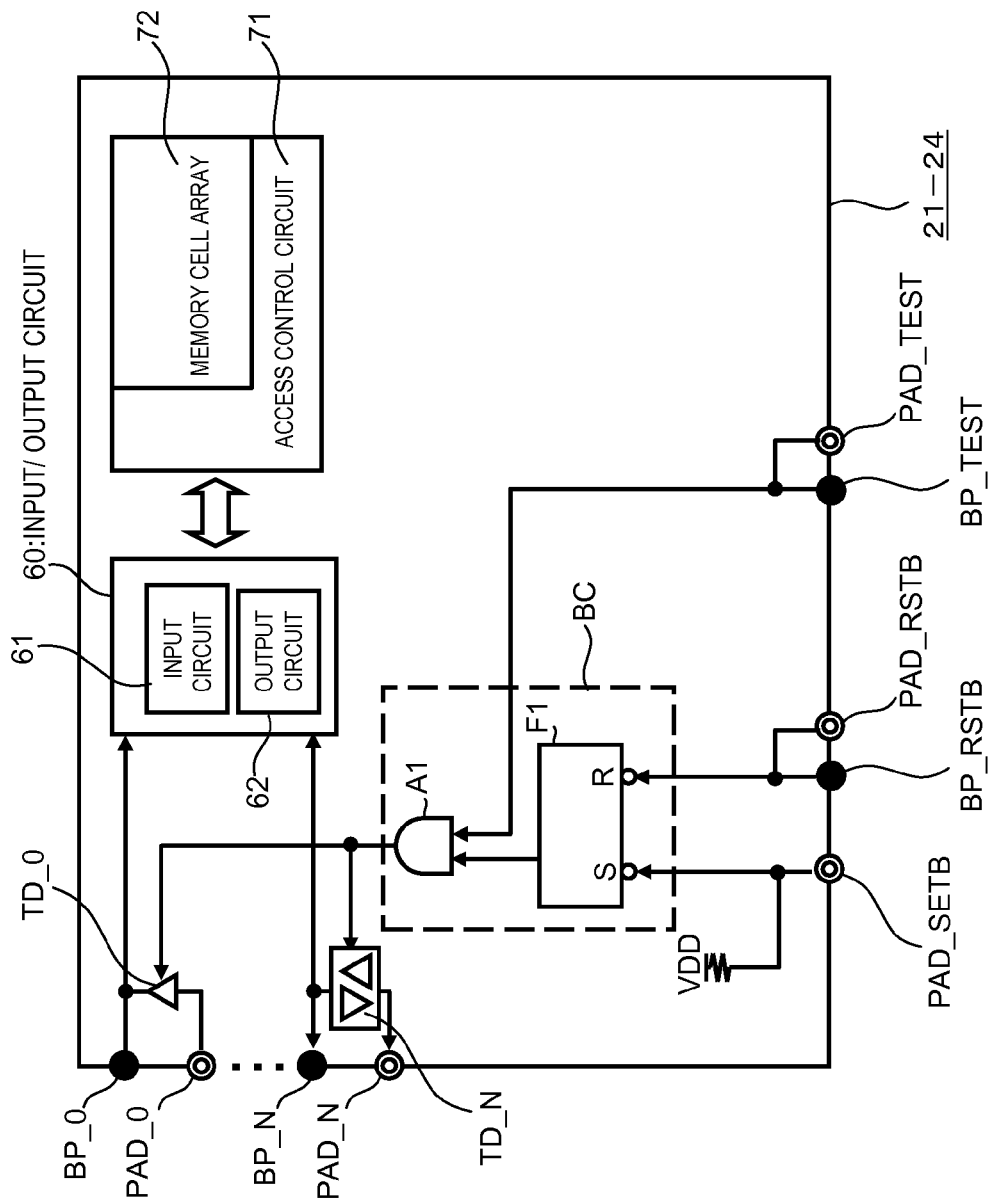
FIG. 6 is a block diagram of a semiconductor chip in a modification of the exemplary embodiment 1.
Figure 7:
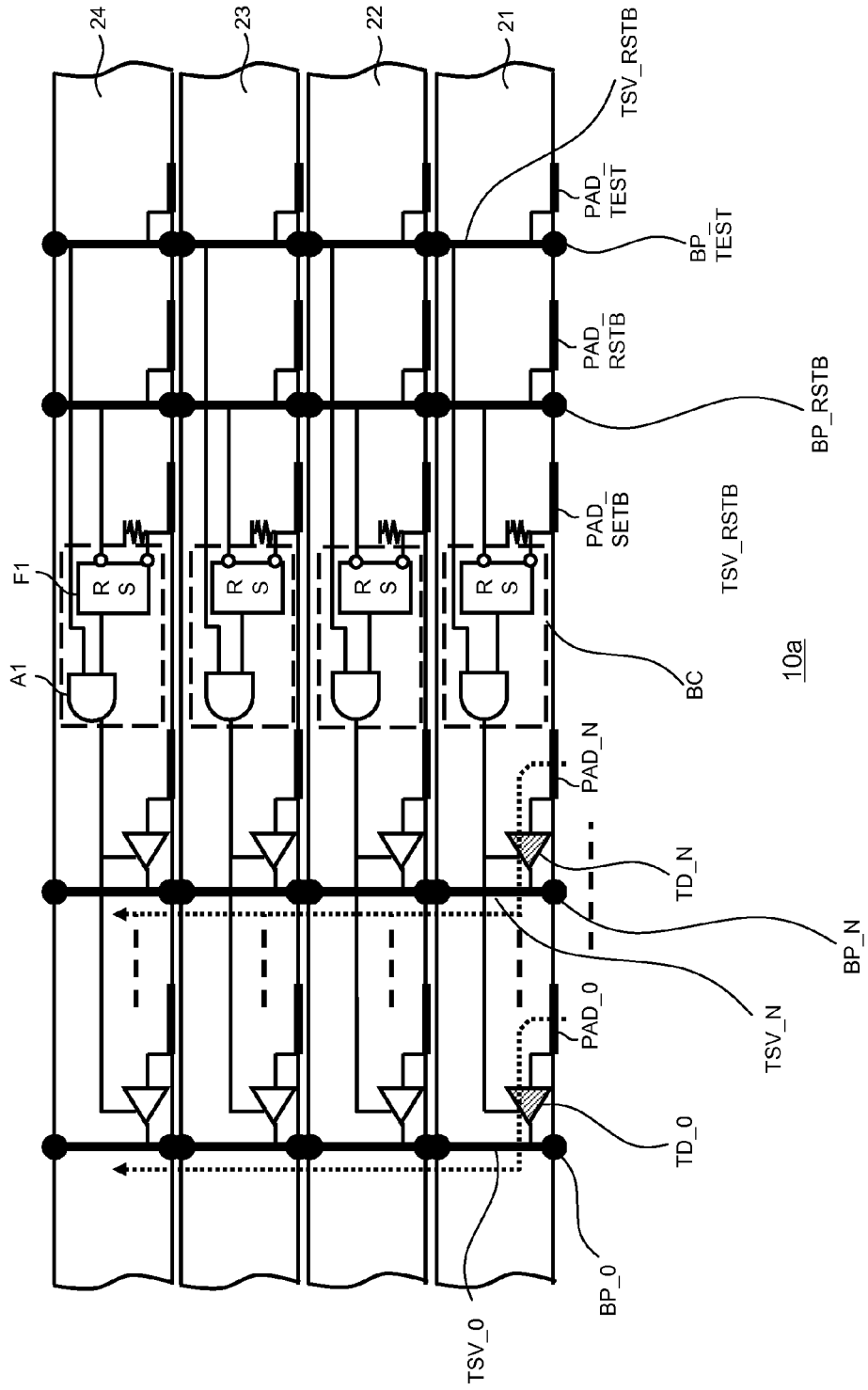
FIG. 7 is a block diagram showing a state in which a plurality of semiconductor chips are stacked together in the modification of the exemplary embodiment 1.

FIG. 6 depicts a block diagram showing the inside of a semiconductor chip according to a modification of the exemplary embodiment 1. FIG. 7 is a block diagram of a stacked memory chip part 10a obtained on stacking a plurality of the semiconductor chips shown in FIG. 6. Only the points of difference in configuration and operation of the present modification, shown in FIGS. 6 and 7, from the exemplary embodiment 1, will now be explained. The portions of the present modification of FIGS. 6 and 7, which are substantially the same in configuration and operation as those of the exemplary embodiment 1, are denoted by the same reference numerals, and redundant explanation is dispensed with.

Referring to FIG. 6, the buffer controller BC of the modification of the exemplary embodiment 1 includes an AND circuit A1 in addition to the set reset flipflop circuit F1. In FIG. 6, the set reset flip-flop circuit F1 is substantially analogous with the buffer controller BC, in its entirety, of the exemplary embodiment 1 shown in FIG. 4. In the modification of the exemplary embodiment 1, shown in FIG. 6, the AND circuit A1 takes an AND of the output terminal of the set reset flip-flop circuit F1 and a test entry signal entered from a bump electrode BP_TEST. An output signal of the AND circuit A1 becomes an output signal of the buffer controller BC of the present modification. The bump electrode BP_TEST is connected to an input pad PAD_TEST for a test entry signal as well.

Referring to FIG. 7, when the stacked memory chip part 10a is assembled, the bump electrode BP_TEST for the test entry signal, like other bump electrodes BP_0 to BP_N and BP_RSTB, is connected common to the bump electrodes BP_TEST for the test entry signals for the stacked memory devices 21 to 24 by the penetrating electrodes TSV_RSTB. The bump electrodes BP_TEST are also connected to input pads PAD_TEST for the test entry signals of the memory devices 21 to 24. However, only the pad PAD_TEST of the memory device 21 exposed on the surface of the stacked memory chip part 10a is used for delivery of the test entry signal. If once the stacked memory chip part 10a has been completed, the input pads PAD_TEST for the test entry signals for the memory devices 22 to 24 are not used for delivery of the test entry signals.

The operation of the modification of the exemplary embodiment 1, shown in FIGS. 6 and 7, will now be explained. In the present modification, not only the active level set signal SETB from the test pad PAD_SETB of the memory device 21 is supplied from the external test device, but also the input pad PAD_TEST for the test entry signal of the memory device 21 continues to be maintained at the active level (HIGH level) to permit activation of the test buffers TD_0 to TD_N. During the normal operation, the test entry signal TEST is fixed at the non-active level or LOW level to prevent mistaken activation of the test buffers TD_0 to TD_N from occurring during the normal operation.

Exemplary Embodiment 2

Figure 8:
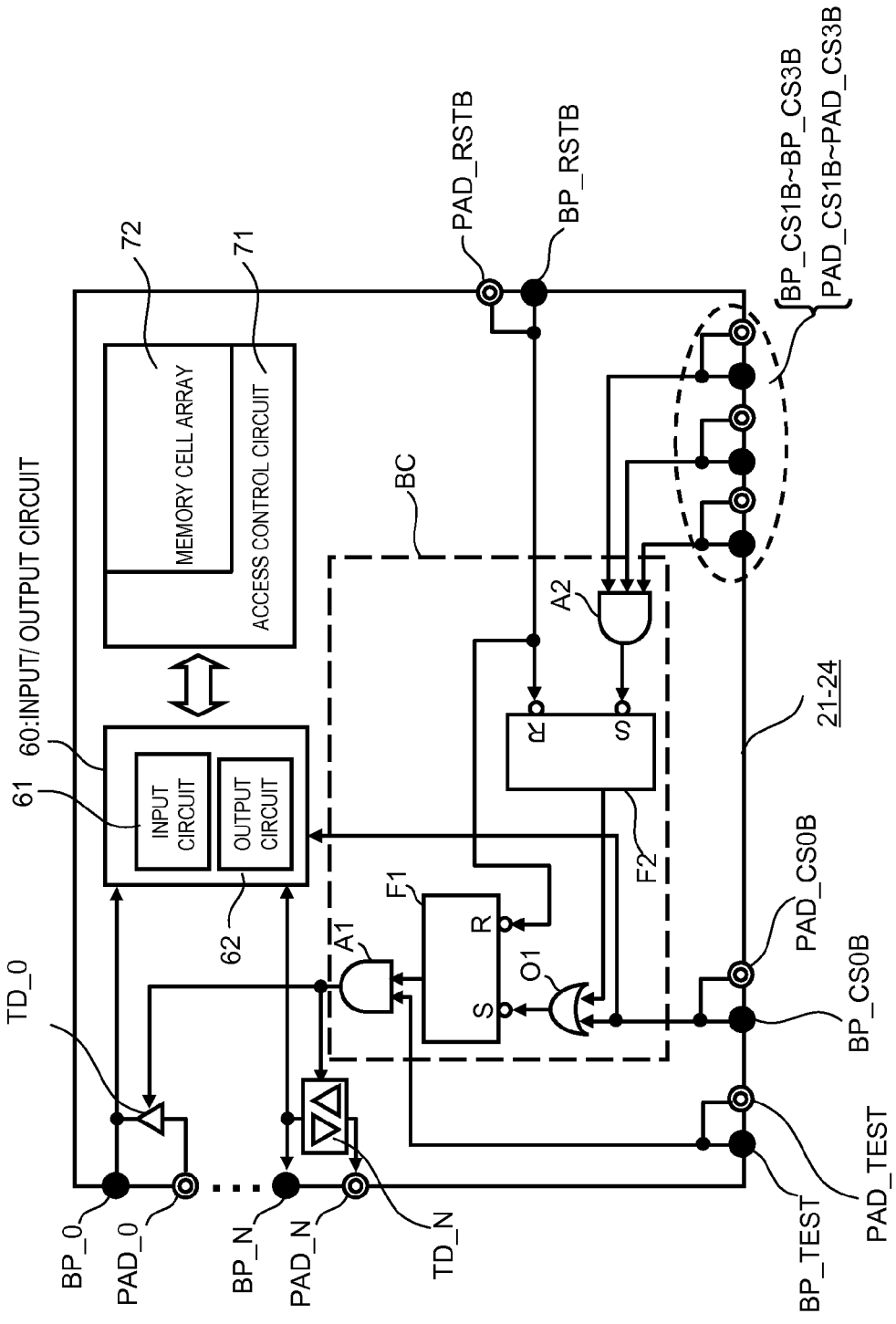
FIG. 8 is a block diagram of a semiconductor chip in an exemplary embodiment 2.
Figure 9:
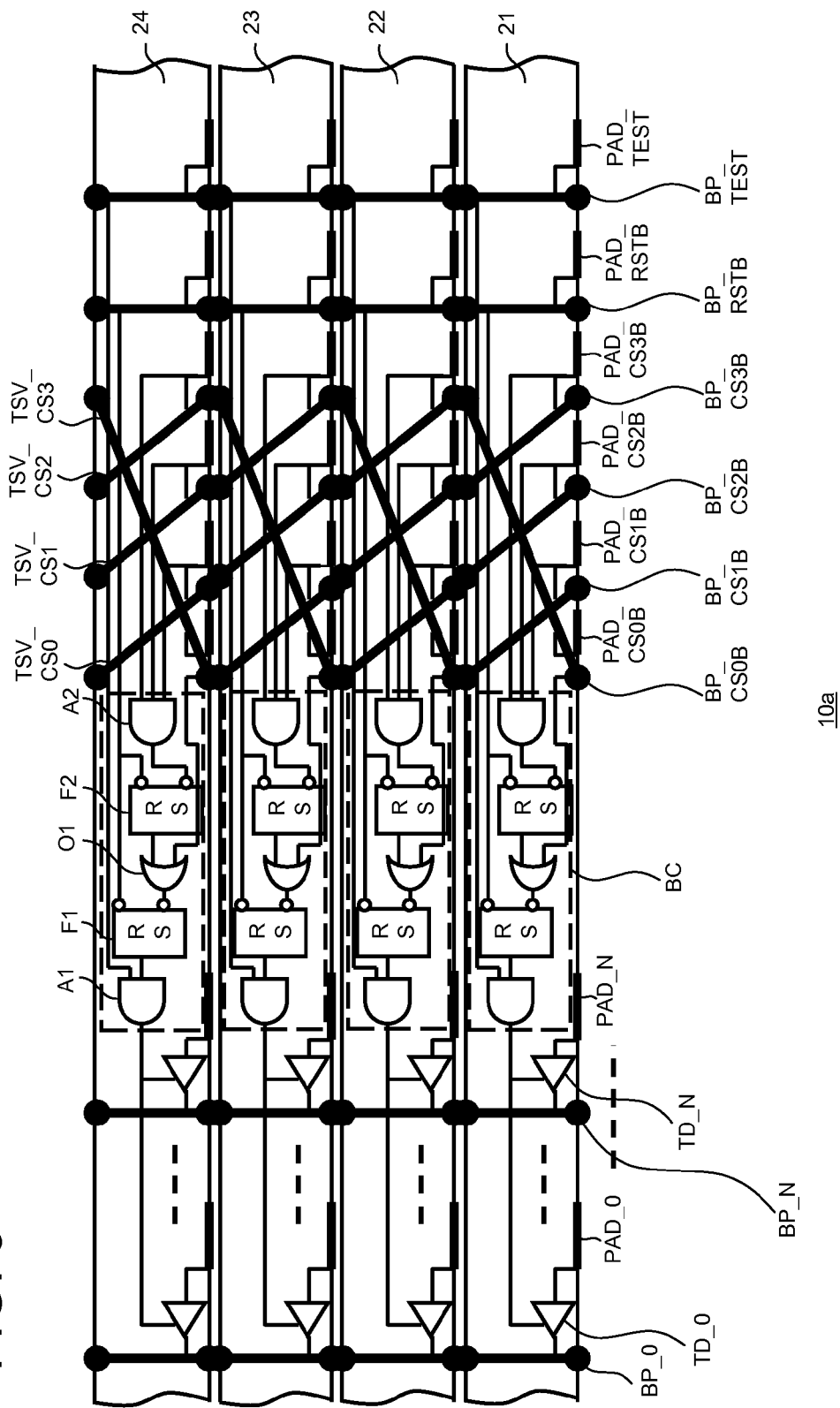
FIG. 9 is a block diagram showing a state in which a plurality of semiconductor chips are stacked together in the exemplary embodiment 2.

FIG. 8 is a block diagram showing the inside of a semiconductor chip in an exemplary embodiment 2. FIG. 9 depicts a block diagram showing the state in which the semiconductor chips of FIG. 8 are assembled to the state of the stacked memory chip part 10a. The portions of the present exemplary embodiment, which are the same as those of the exemplary embodiment 1 in configuration and operation, are denoted by the same reference numerals, and redundant explanation is dispensed with. In the exemplary embodiment 2, shown in FIG. 8, entry to the test operation mode is by a TEST signal, a pre-existing test entry signal, connected to a bump electrode BP_TEST and to a pad PAD_TEST, and a chip select signal CS0B, a part of the command signal, connected to a bump electrode BP_CS0B and a pad PAD_CS0B. In distinction from the exemplary embodiment 1, it is unnecessary to provide an additional test pad PAD_SETB for testing the stacked memory chip part 10a. The buffer controller BC of the exemplary embodiment 2 includes set reset flipflop circuits F1, F2, AND circuits A1, A2 and an OR circuit O1.

Referring to FIG. 9, the chip select signals CS0B to CS3B, identification signals for selecting the memory devices 21 to 24, unlike other signals, are not delivered by the penetrating electrodes which are common to the memory devices 21 to 24. Instead, chip select signals CS0B to CS3B, coupled to the memory devices 21 to 24, are connected with offset. That is, penetrating electrodes TSV_CS0 to TSV_CS3, connecting the chip select signals, are connected not to reverse side bump electrodes, provided at positions in register with the bump electrodes, with the substrate in-between, but to reverse side bump electrodes provided at offset positions. When the stacked memory chip part 10a is completed, the penetrating electrodes TSV_CS0 to TSV_CS3 of the memory devices 21 to 24 spirally connect the bump electrodes.

(Test Operation of the Stacked Memory Chip Part 10)

The testing operation for the stacked memory chip part 10a is commenced, as in the exemplary embodiment 1, from the test pads (PAD_0 to PAD_N, PAD_TEST, PAD_CS0B, PAD_RSTB) of the memory device 21. To enter into the test mode, PAD_TEST, PAD_CS0B and PAD_RSTB are used. It is noted that, during testing of the stacked memory chip part 10a, it is necessary to maintain PAD_CS1B to PAD_CS3B at a non-active level (HIGH level).

A test signal of an active level (HIGH level) is supplied from the test pad PAD_TEST of the memory device 21. This allows controlling the buffer control signal of the memory device 21 by the set reset flipflop circuit F1.

An active level (LOW level) reset signal RSTB is delivered from the test pad PAD_RSTB of the memory device 21. The reset signal RSTB is connected to the memory devices 21 to 24 via the bump electrodes BP_RSTB and the penetrating electrodes. Hence, the set reset flipflop circuits F1, F2 of the memory devices 21 to 24 are reset (with outputs of F1, F2 going LOW).

An active level (LOW level) chip select signal CS0B is supplied to the test pad PAD_CS0B of the memory device 21. At this time, the test pads PAD_CS0B to PAD_CS3B of the memory device 21 are maintained at a non-active level (HIGH level). In the memory device 21, an output of the OR circuit O1 goes LOW to set the set reset flipflop circuit F1 of the memory device 21. As a result, a buffer control signal, output from the AND circuit A1, is activated (HIGH level) to activate the test buffers TD_0 to TD_N. This connects the test pads PAD_0 to PAD_N to the associated penetrating electrodes TSV_0 to TSV_N.

In the memory devices 22 to 24, an output of the AND circuit A2 goes LOW to set the set reset flipflop circuit F2 which then outputs a HIGH level. An output of the OR circuit O1 then goes HIGH. An output signal of the AND circuit A1, which becomes an output signal of the buffer controller BC, goes LOW to provide a non-active level. Since the test buffers TD_0 to TD_N are deactivated, the test pads PAD_0 to PAD_N remain electrically disconnected from the associated penetrating electrodes TSV_0 to TSV_N.

In this state, desired test signals are input/output via test pads PAD_0 to PAD_N of the memory device 21. The stacked memory chip part 10a may thus be tested without probing bump electrodes.

After the end of testing of the stacked memory chip part 10a, an active level (LOW level) reset signal RSTB is delivered from the test pad PAD_RSTB of the memory device 21. The set reset flip-flop circuits F1, F2 of the memory devices 21 to 24 are reset, with the respective outputs going LOW, by way of default setting. The testing then comes to a close.

(Normal Operation)

After the stacked memory chip part 10a is assembled with the memory controller 30 and the interposer 40 to provide the semiconductor device 10, no active level (HIGH level) test signal is delivered from the test pad, such as PAD_TEST. The test buffers TD_0 to TD_N may thus be set in the non-active state at all times without dependency upon the state of the set reset flipflop circuit F2.

(Meritorious Effect of the Exemplary Embodiment 2)

In the exemplary embodiment 2, the test mode for the stacked memory chip part 10a may be set using the chip select signals CS0B to CS3B, without the necessity of providing a dedicated test pad of the stacked memory chip part 10a (PAD_SETB), thus adding to the meritorious effect of the exemplary embodiment 1.

Exemplary Embodiment 3

Figure 10:
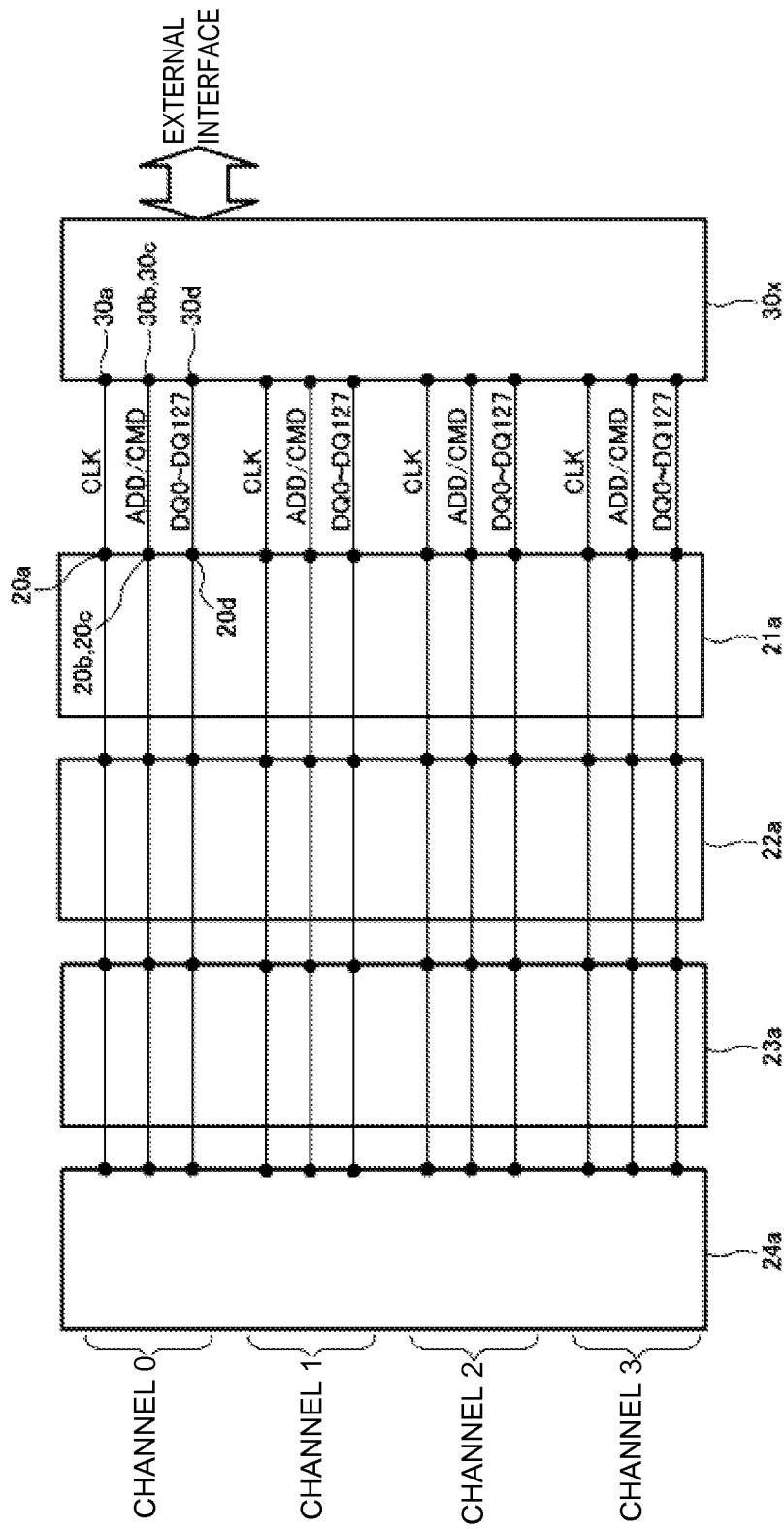
FIG. 10 is a block diagram for illustrating an interconnect structure in an exemplary embodiment 3.

FIG. 10 depicts a block diagram for illustrating an interconnect structure for an exemplary embodiment 3 of the semiconductor device 10 shown in FIG. 2.

In the exemplary embodiment 3, shown in FIG. 10, each of memory devices 21a to 24a has four channels (channel 0 to channel 3) and is connected common to the memory controller 30x from channel to channel. Each of the memory devices 21a to 24a includes, from channel to channel, a clock terminal 20a, an address terminal 20b, a command terminal 20c and a data terminal 20d, which are respectively connected to a clock terminal 30a, an address terminal 30b, a command terminal 30c and a data terminal 30d of the memory controller 30 from channel to channel.

In the semiconductor device, having the above described configuration, the units explained in connection with the exemplary embodiment 1, its modification, and exemplary embodiment 2, shown in FIGS. 4, 6 and 8, such as buffer controller BC, may be provided from channel to channel. In place of providing the buffer controller BC from channel to channel, a buffer controller common to the four channels may be provided for each of the memory devices 21a to 24a.

Exemplary Embodiment 4

Figure 11:
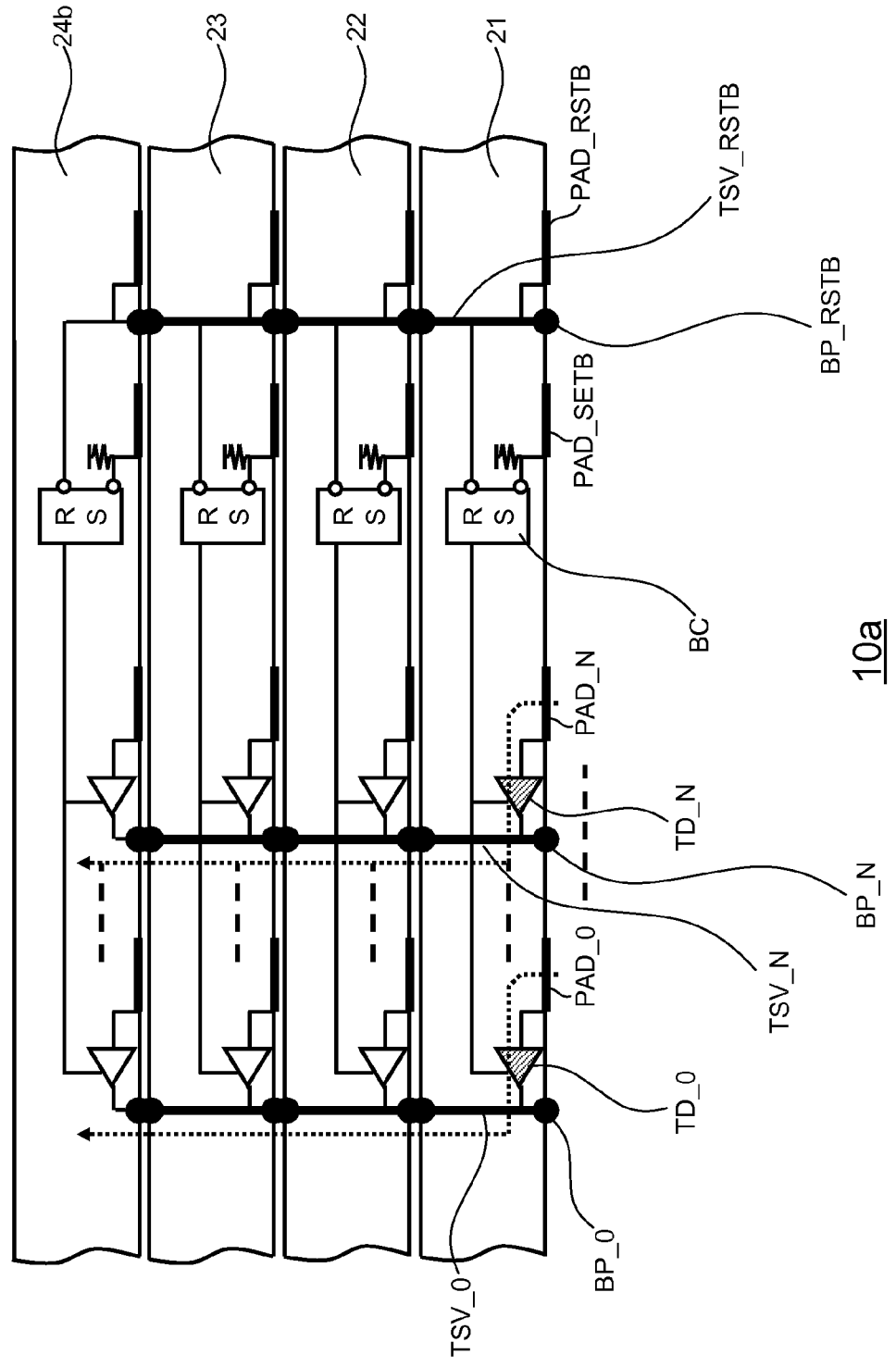
FIG. 11 is a block diagram showing a state in which a plurality of semiconductor chips are stacked together in an exemplary embodiment 4.

FIG. 11 depicts a block diagram showing stacked memory chip part 10a of an exemplary embodiment 4. Only the points of difference of FIG. 11 from the exemplary embodiment 1 shown in FIG. 5 will be explained. The same components as those shown in FIG. 5 are indicated by the same reference numerals and the corresponding explanation is dispensed with.

In the exemplary embodiment 4, shown in FIG. 11, penetrating electrodes are provided in the memory devices 21 to 23, but not in the uppermost memory device 24b. The memory devices 21 to 23 and 24b are of the face-down type, that is, are stacked with the sides carrying the test pads PAD to PAD_N downwards, that is, with the sides carrying the circuit elements in the semiconductor substrate downwards. There is thus no necessity to provide the penetrating electrodes in the uppermost memory device 24b. The process of providing the penetrating electrodes in the uppermost layer is omitted. However, the inner configuration of the present exemplary embodiment is substantially the same as that shown in FIG. 4, except that the bump electrodes are not connected to the penetrating electrodes. Of course, the testing of the singulated memory devices and that of the stacked memory chip part 10a composed of the memory devices are carried out in the same way as in the exemplary embodiment 1.

Figure 12:
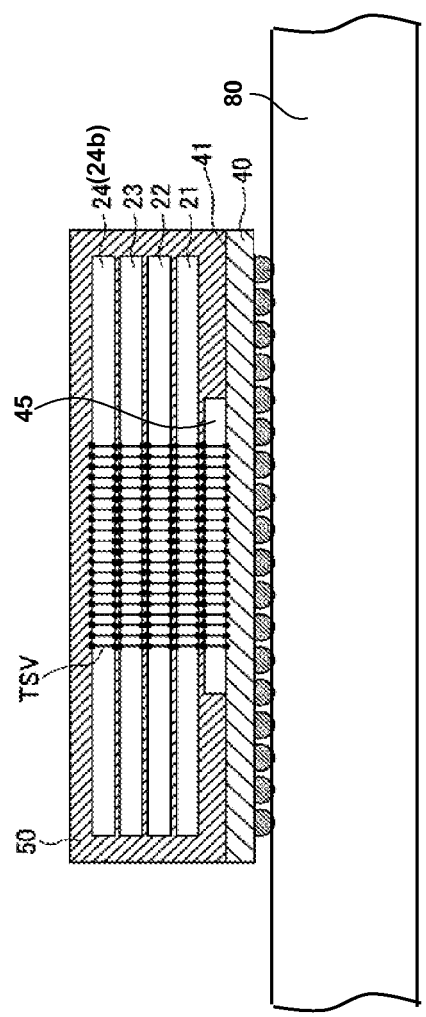
FIG. 12 is a cross-sectional view showing an example implementation to a printed circuit board of the semiconductor device of each exemplary embodiment.

FIG. 12 shows an example implementation of a semiconductor device 10 according to any one of the exemplary embodiments 1 to 4. The test pads, test buffers and the buffer controllers are not shown for simplicity of the drawings. In the present example implementation, the memory devices are general-purpose memories (DRAMs). The semiconductor device 10 is provided on a memory controller 45 that controls the general-purpose DRAMs. The clocks, commands, addresses and data terminals of each of the DRAMs 21 to 24 (24b) are connected in common and connected to associated terminals of a memory controller 45. The controller 45 is implemented on a package substrate 40 and the entire components are encapsulated with resin to complete a multi-chip module. The module may be implemented as motherboard on a wiring substrate 80 along with other semiconductor chips, such as MPU or CPU, or with electronic components. It is noted that a package substrate 40 may be formed of an insulator and an electrically conductive material on the surface or in the inside of the insulator, and hence may be said to be a wiring substrate. It may thus be similar to the wiring substrate 80 as motherboard.

Figure 13:
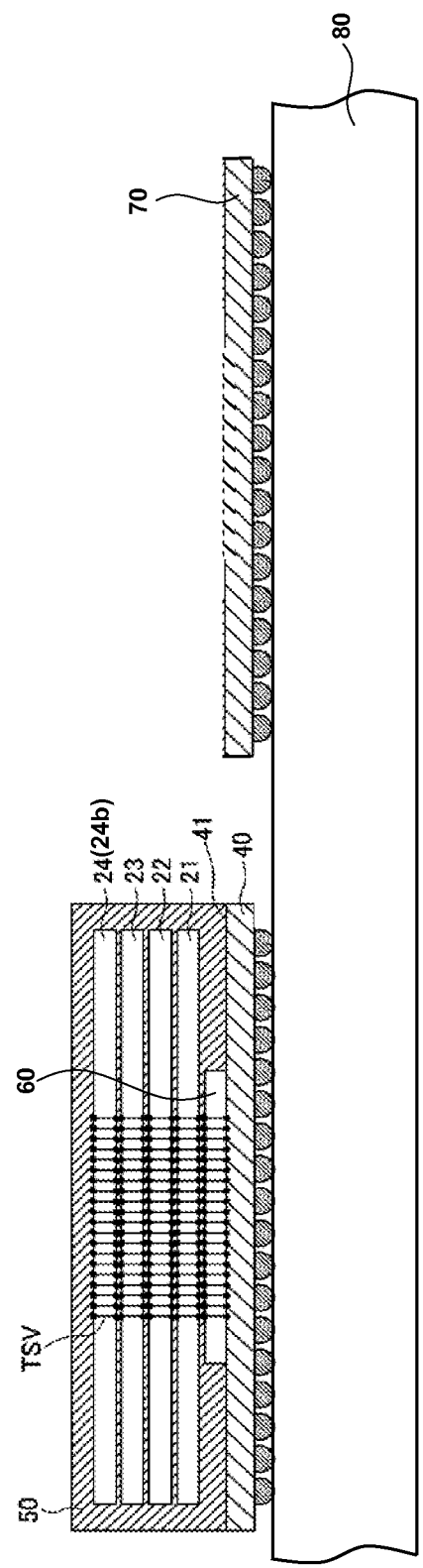
FIG. 13 is a cross-sectional view showing another example implementation to a printed circuit board of the semiconductor device of each exemplary embodiment.

FIG. 13 shows another example implementation of the semiconductor device 10 according to the exemplary embodiments 1 to 4. The test pads, test buffers and the buffer controllers are omitted for simplicity of the drawings. In the present example implementation, the memory devices of the semiconductor device 10 are core memories and an interfacing portion to the memory controller is omitted. An interface chip 60 performs the role as interface. The interface chip 60 is implemented on a package substrate 40 on which a stacked memory chip 10 is stacked. The module and a memory controller 70 are implemented on a printed wiring substrate 80 as a motherboard.

It is noted that the functions of the memory controllers 45, 70 may be owned by a micro-processor/micro-controller itself. The memory controller 45 and/or the interface chip 60 may be implemented on the wiring substrate 80 without interposition of the package substrate 40.

In the exemplary embodiments, described above, the number of memory devices implemented on the stacked memory chip part 10a, is four. However, the number of the memory devices, implemented on the stacked memory chip part 10a, may be selected arbitrarily. Although the semiconductor chips stacked are memory devices, in the above described exemplary embodiments, the semiconductor chips may, of course, be components other than the memory devices.

The disclosure of the aforementioned Patent Document 1 is incorporated by reference herein. The particular exemplary embodiments or examples may be modified or adjusted within the scope of the entire disclosure of the present invention, inclusive of claims, based on the fundamental technical concept of the invention. In addition, a variety of combinations or selection of elements disclosed herein may be made within the context of the claims. The present invention may thus cover a wide variety of modifications or corrections that may occur to those skilled in the art in accordance with the entire disclosure of the present invention, inclusive of claims, and the technical concept of the present invention.

What is claimed is:

1. A device comprising:
a semiconductor substrate;
a first penetrating electrode penetrating through the semiconductor substrate;
a first test pad;
a first tri-state buffer coupled between the first penetrating electrode and the first test pad and receiving a buffer control signal at a control terminal thereof; and
a buffer control circuit supplying the buffer control signal to the first tri-state buffer,
wherein, in response to the buffer control signal being a first level, the device enters a test operation mode where the test pad is electrically connected to the first penetrating electrode through the first tri-state buffer.

2. The device as claimed in claim 1, further comprising a second test pad coupled to the buffer control circuit and wherein the buffer control circuit is configured to generate the buffer control signal in response to a first signal that is externally supplied via the second test pad.

3. The device as claimed in claim 2, further comprising a third test pad coupled to the buffer control circuit and wherein the buffer control circuit is configured to stop generating the buffer control signal in response to a reset signal that is externally supplied via the third test pad.

4. The device as claimed in claim 3, further comprising a second penetrating electrode penetrating through the semiconductor substrate, and wherein the third test pad is coupled to the second penetrating electrode.

5. The device as claimed in claim 1, further comprising:
    a plurality of second penetrating electrodes each penetrating through the semiconductor substrate;
    a plurality of second test pads; and
    a plurality of second tri-state buffers each coupled between an associated one of the second penetrating electrodes and an associated one of the second test pads, the second tri-state buffers receiving the buffer control signal at control terminals thereof.

6. The device as claimed in claim 1, wherein the first tri-state buffer connects the first test pad to the first penetrating electrode when the device is in a test operation and the first tri-state buffer disconnects the first test pad from the first penetrating electrode when the device is in a normal operation.

7. A device comprising:
    a first semiconductor chip that comprises:
        a first semiconductor substrate including first and second main surfaces opposite to each other;
        a first penetrating electrode penetrating through the first semiconductor substrate;
        a first terminal formed on a side of the first main surface of the first semiconductor substrate and electrically connected to the first penetrating electrode;
        a second terminal formed on a side of the second main surface of the first semiconductor substrate and electrically connected to the first penetrating electrode;
        a first test pad formed on a side of the first main surface of the first semiconductor substrate;
        a first tri-state buffer formed on a side of the first main surface of the first semiconductor substrate, coupled between the first penetrating electrode and the first test pad, and receiving a first buffer control signal at a control terminal thereof; and
        a first buffer control circuit supplying the first buffer control signal to the first tri-state buffer, wherein, in response to the first buffer control signal being a first level, the device enters a test operation mode where the first test pad is electrically connected to the first penetrating electrode through the first tri-state buffer; and
    a second semiconductor chip stacked with the first semiconductor chip and comprising:
        a second semiconductor substrate including third and fourth main surface opposite to each other; and
        a third terminal formed on a side of the third main surface of the second semiconductor substrate and electrically connected to the second terminal of the first semiconductor chip.

8. The device as claimed in claim 7, wherein the first semiconductor chip further comprises a second test pad formed on a side of the first main surface of the first semiconductor substrate, coupled to the first buffer control circuit and wherein the first buffer control circuit is configured to generate the first buffer control signal in response to a first signal that is externally supplied via the second test pad.

9. The device as claimed in claim 8, wherein the first semiconductor chip further comprises a third test pad formed on a side of the first main surface of the first semiconductor substrate, coupled to the first buffer control circuit and wherein the first buffer control circuit is configured to stop generating the first buffer control signal in response to a reset signal that is externally supplied via the third test pad.

10. The device as claimed in claim 9, wherein the first semiconductor chip further comprises:
    a third penetrating electrode penetrating through the first semiconductor substrate and electrically connected to the third test pad; and
    a fourth terminal formed on a side of the second main surface of the first semiconductor substrate and electrically connected to the third penetrating electrode, and
    the second semiconductor chip further comprises:
        a fourth test pad formed on a side of the third main surface of the second semiconductor substrate;
        a fifth terminal formed on a side of the third main surface of the second semiconductor substrate and electrically connected to the fourth terminal of the first semiconductor chip;
        a second tri-state buffer formed on a side of the third main surface of the second semiconductor substrate, coupled between the third terminal and the fourth test pad, and receiving a second buffer control signal at a control terminal thereof; and
        a second buffer control circuit supplying the second buffer control signal to the second tri-state buffer, the second buffer control circuit being coupled to the fifth terminal and being configured to stop generating the second buffer control signal in response to the reset signal that is supplied via the fifth terminal.

11. The device as claimed in claim 7, wherein the first semiconductor chip further comprises:
    a plurality of second penetrating electrodes each penetrating through the first semiconductor substrate;
    a plurality of fourth terminals each formed on a side of the first main surface of the first semiconductor substrate and electrically connected to an associated one of the second penetrating electrode;
    a plurality of fifth terminals each formed on a side of the second main surface of the first semiconductor substrate and electrically connected to an associated one of the second penetrating electrode;
    a plurality of second test pads each formed on a side of the first main surface of the first semiconductor substrate; and
    a plurality of second tri-state buffers each formed on a side of the first main surface of the first semiconductor substrate, coupled between an associated one of the second penetrating electrodes and an associated one of the second test pads, the second tri-state buffers receiving the first buffer control signal at control terminals thereof; and
    the second semiconductor chip further comprises a plurality of sixth terminals each formed on a side of the third main surface of the second semiconductor substrate and electrically connected to an associated one of the fifth terminals of the first semiconductor chip.

12. The device as claimed in claim 7, wherein the first tri-state buffer of the first semiconductor chip connects the first test pad to the first penetrating electrode when the device is in a test operation and the first tri-state buffer of the first semiconductor chip disconnects the first test pad from the first penetrating electrode when the device is in a normal operation.

13. The device as claimed in claim 7, wherein the first semiconductor chip further comprises:

a first electronic circuit attaining circuit operations; and a first input buffer coupled between the first penetrating electrode and the first electronic circuit; and the second semiconductor chip further comprises:

a second electronic circuit attaining circuit operations; and a second input buffer coupled between the third terminal and the second electronic circuit.

14. The device as claimed in claim 7, wherein the second semiconductor chip further comprises:

a second penetrating electrode penetrating through the second semiconductor substrate and electrically connected to the third terminal; and a fourth terminal formed on a side of the fourth surface of the second semiconductor substrate and electrically connected to the second penetrating electrode, and the device further comprises a third semiconductor chip that is stacked with first and second semiconductor chips such that the second semiconductor chip is sandwiched between the first and third semiconductor chips, the third semiconductor chip comprises:

a third semiconductor substrate including fifth and sixth main surface opposite to each other; and a fifth terminal formed on a side of the fifth main surface of the third semiconductor substrate and electrically connected to the fourth terminal of the second semiconductor chip.

15. A device comprising:

a first semiconductor chip that comprises:

a first semiconductor substrate including first and second main surfaces opposite to each other;

a first memory circuit formed on a side of the first main surface of the first semiconductor substrate;

a first penetrating electrode penetrating through the first semiconductor substrate;

a first terminal formed on a side of the first main surface of the first semiconductor substrate and electrically connected to the first memory circuit and the first penetrating electrode;

a second terminal formed on a side of the second main surface of the first semiconductor substrate and electrically connected to the first penetrating electrode;

a first test pad formed on a side of the first main surface of the first semiconductor substrate;

a first tri-state buffer formed on a side of the first main surface of the first semiconductor substrate, coupled between the first penetrating electrode and the first test pad, and receiving a first buffer control signal at a control terminal thereof; and a first buffer control circuit supplying the first buffer control signal to the first tri-state buffer, wherein, in response to the first buffer control signal being a first level, the device enters a test operation mode where the first test pad is electrically connected to the first penetrating electrode through the first tri-state buffer; and a second semiconductor chip stacked with the first semiconductor chip to form a chip-stack structure, the second semiconductor chip comprising:

a second semiconductor substrate including third and fourth main surface opposite to each other;

a second memory circuit formed on a side of the third main surface of the second semiconductor substrate; and a third terminal formed on a side of the third main surface of the second semiconductor substrate and electrically connected to the second memory circuit, the third terminal being electrically connected to the second terminal of the first semiconductor chip; and a controller chip coupled to the chip-stack structure to perform data read/write operations on each of the first and second memory circuits.

16. The device as claimed in claim 15, further comprising a wiring board, the controller chip being mounted over the wiring board, and the chip-stack structure being mounted over the controller chip.

17. The device as claimed in claim 16, further comprising an insulating material formed on the wiring board to encapsulate the controller chip and the chip-stack structure.

18. The device as claimed in claim 15, further comprising an interface chip and first and second wiring boards, the interface chip intervening between the controller chip and the chip-stack structure to control the chip-stack structure under control of the controller chip, the interface chip being mounted over the first wiring board, the chip-stack structure being mounted over the interface chip, the first wiring board being mounted over the second wiring board, and the controller chip being mounted over the second wiring board.

19. The device as claimed in claim 18, further comprising an insulating material formed on the first wiring board to encapsulate the interface chip and the chip-stack structure.

20. The device as claimed in claim 15, wherein the first semiconductor chip further comprises a second test pad formed on a side of the first main surface of the first semiconductor substrate, coupled to the first buffer control circuit and wherein the first buffer control circuit is configured to generate the first buffer control signal in response to a first signal that is externally supplied via the second test pad.

* * * * *